United States Patent [19]
Mertz et al.

[11] Patent Number: 5,153,802
[45] Date of Patent: Oct. 6, 1992

[54] STATIC SWITCH

[75] Inventors: Jean-Luc Mertz; Pierre Perichon, both of Grenoble; Bruno Beranger, Biviers, all of France

[73] Assignee: Merlin Gerin, Meylan, France

[21] Appl. No.: 709,830

[22] Filed: Jun. 4, 1991

[30] Foreign Application Priority Data

Jun. 12, 1990 [FR] France ................... 90 07385

[51] Int. Cl.[5] .......................................... H02H 9/04
[52] U.S. Cl. ...................................... 361/18; 361/91; 323/908; 323/285
[58] Field of Search ............. 361/18, 58, 91, 93; 323/901, 908, 266, 285–286; 307/135; 363/49, 50

[56] References Cited

U.S. PATENT DOCUMENTS 4,307,440 12/1981 Inoue et al. .................... 323/266
4,937,697 6/1990 Edwards et al. ................. 361/18

FOREIGN PATENT DOCUMENTS 0272514 6/1988 European Pat. Off. .
0369448 5/1990 European Pat. Off. .

OTHER PUBLICATIONS

Patent Abstracts of Japan, vol. 13, No. 123 (E-733) [3471], Mar. 27, 1989.

*Primary Examiner*—A. D. Pellinen
*Assistant Examiner*—C. Schultz
*Attorney, Agent, or Firm*—Parkhurst, Wendel & Rossi

[57] ABSTRACT

For a preset period following application of a closing order, the semi-conductor of the static power switch, supplied with DC voltage, is controlled by a regulating circuit so as to operate as a current generator limiting the current to a value much lower than its rated value. A fuse acts as measuring shunt. The switch can comprise a circuit breaker function. In this case, the fault detection circuit measures the voltage at the terminals of the semi-conductor and supplies an opening signal when this voltage exceeds a preset threshold.

10 Claims, 5 Drawing Sheets

STATIC SWITCH

BACKGROUND OF THE INVENTION

The invention relates to a static switch comprising a semi-conductor, designed to be connected in series with a load to the terminals of a DC voltage supply, and means for controlling an operating voltage of the semi-conductor comprising means for measuring the current flowing in the semi-conductor and means for regulating the operating voltage of the semi-conductor in terms of said current.

The document FR-A-2,618,176 mentions in its introduction a switch of this type comprising means designed to make the switch open when the current flowing through the latter exceeds a preset value for a certain time (circuit breaker function) and limiting, by current regulation, the current in the semi-conductor to a high value, lower than the current limits of the semi-conductor, during the time delay period. To prevent spurious trips, notably when the switch closes on a capacitive load, the time delay must be sufficiently long. However, in the event of a fault, the power dissipated in the semi-conductor is high during the time delay, which makes limitation of this time advisable. To reconcile these opposing constraints and enable progressive switching limiting the overvoltages or overcurrents, the above-mentioned document proposes a switching device, designed notably for aeronautics, comprising semi-conductors associated with resistors and connected in parallel so as to form an electronic rheostat and which are turned on successively, according to the current flowing through the device.

SUMMARY OF THE INVENTION

The object of the present invention is to achieve a static switch, notably a power switch, which can be used without any drawbacks with a capacitive load. Such a load is, for example, constituted by the capacity of a cable, by a capacitor or by a chopping power supply.

The switch according to the invention is characterized in that the control means comprise a time delay circuit to one input of which a switch closing or opening signal is applied, means connected to an output of the time delay circuit, designed to produce a rated operating voltage of the semi-conductor after a preset time delay period following application of a closing signal to the input of the time delay circuit, the regulated operating voltage produced by the regulating means being applied to the semi-conductor during said time delay period so that the semi-conductor operates, during this period, as a current generator, limiting the current to a preset value much lower than the rated current of the switch.

To give an example, the current can be limited to 100 mA for 2 s, before switching to its rated value, for example 30 A.

The switch preferably also comprises means of grounding the semi-conductor operating electrode when a switch opening signal is applied to the input of the time delay circuit and during a very short preset time following application of a closing signal in order to enable the regulating means to be zero reset.

According to a development of the invention, the means of measuring the current are formed by a fuse connected in series with the semi-conductor, the voltage at the terminals of said fuse, representative of said current, being applied to the input of the regulating means.

The use of a measuring shunt formed by a fuse or by an equivalent resistance component enables the losses by thermal effect to be reduced to as great an extent as possible, when the switch has its rated current flowing through it. In the case of a fuse, the latter normally provides protection in the event of the circuit breaker electronics failing. It can then act in addition as a not very accurate shunt, at no extra cost. If the regulated current, during the time delay period following closing of the switch, is in the order of 100 mA, the voltage at terminals of the fuse is in the order of several hundred microvolts. This very low DC voltage, applied to the input of the regulating means, formed by an amplifying circuit and a comparator, requires the use of an amplifier having a very low offset voltage, and therefore relatively costly.

According to a development of the invention, the regulating means comprise an amplifying circuit with automatic correction of the offset voltage, which enables inexpensive operational amplifiers to be used, whose offset voltage is much greater than the voltage which is applied to their inputs.

An amplifying circuit of this kind preferably comprises a first operational amplifier whose output is connected to a first input of a second operational amplifier and to a no-threshold diode whose cathode is connected to a capacitor, the voltage at the terminals of the capacitor being applied to the second input of the second operational amplifier whose output constitutes the output of the amplifying circuit.

The switch can perform the function of a contactor, and/or of a circuit breaker. When the switch operates as a contactor, the closing and opening orders are external control signals. To operate as a circuit breaker, a switch, preferably of the type described above, comprises fault detection means producing an opening signal in the event of an overload or short-circuit being detected, and reset means producing a closing signal.

Conventionally the fault detection means comprise a fault current measuring device, for example a shunt.

According to a development of the invention, the fault detection means of the switch comprise means of detecting the voltage at the terminals of the semi-conductor and means of producing the opening signal when this voltage exceeds a first preset threshold for a preset time, representative of an overload, or when it exceeds a second preset threshold, representative of a short-circuit, for which the semi-conductor is saturated.

Account is taken of the fact that the rated current flowing through the switch is lower than the saturation current of the latter and corresponds to a low preset voltage at the terminals of the semi-conductor, whereas in the event of a short-circuit, notably, the semi-conductor saturates and the voltage at its terminals increases. Saturation of the semi-conductor in the event of a short-circuit also enables the fault current in the switch to be limited.

According to a particular embodiment, the collector of the semi-conductor being connected to the DC voltage supply via the load, the means of measuring the voltage at the terminals of the semi-conductor comprise a diode whose cathode is connected to the collector of the semi-conductor, and polarized so as to be turned off when said collector voltage exceeds the second threshold, the short-circuit detection means producing an opening signal when said diode is turned off.

According to a preferred embodiment of the invention, the semi-conductor is an insulated gate bipolar transistor (IGBT type transistor), but the invention is also applicable to a bipolar transistor or to a MOSFET type transistor.

BRIEF DESCRIPTION OF THE DRAWINGS

Other advantages and features will become more clearly apparent from the following description of illustrative embodiments of the invention, given as non-restrictive examples only and represented in the accompanying drawings, in which.

DESCRIPTION OF THE PREFERRED EMBODIMENT

Figure 1:
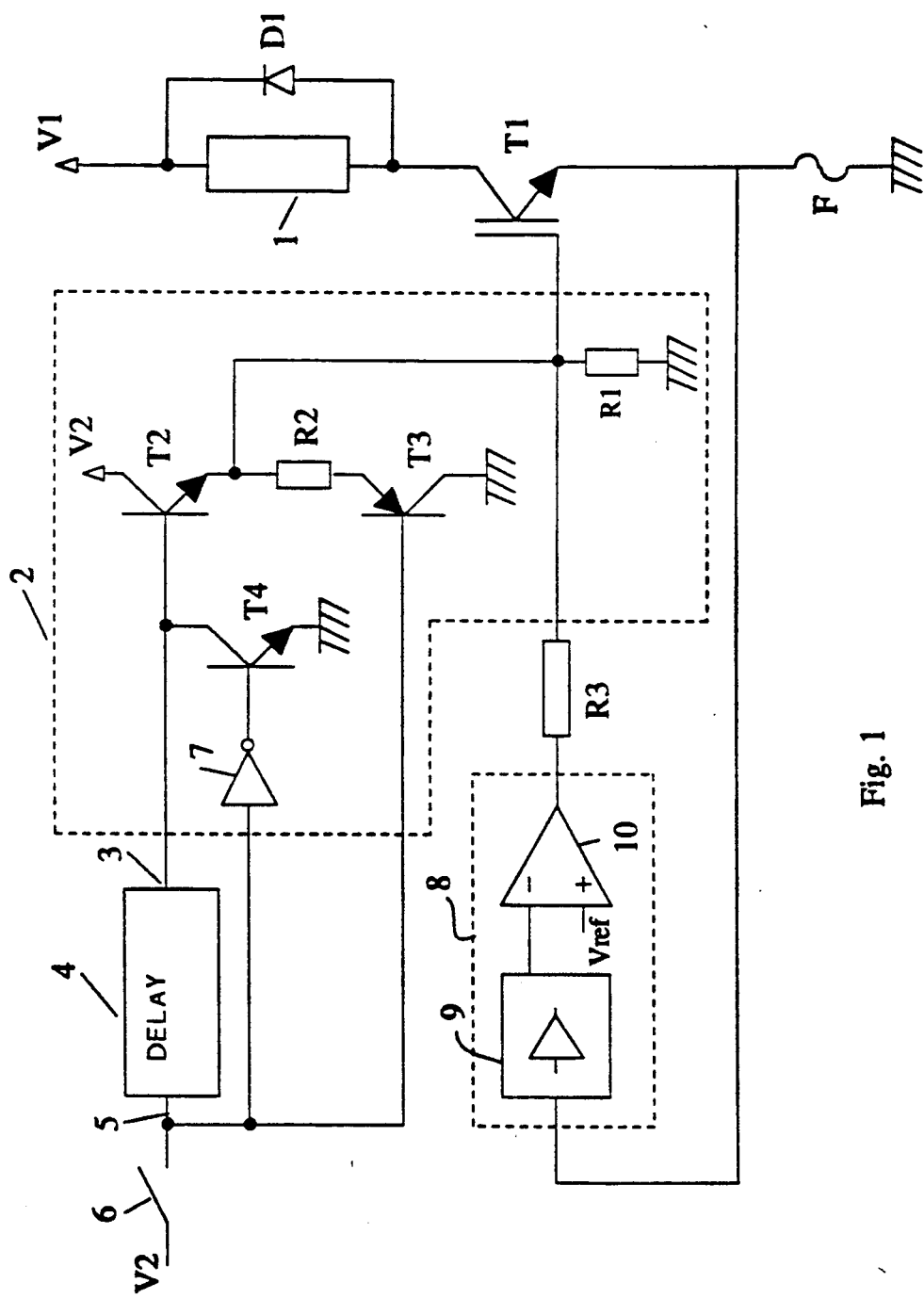
FIG. 1 illustrates, in block diagram form, a switch according to the invention.

The static switch according to FIG. 1 is designed to be connected in series with a load 1 to the terminals of a DC voltage supply V1. In a conventional manner, a diode D1 is connected in parallel on the load to limit the overvoltages at the terminals of the latter. A switch of this kind is more particularly a power switch designed to supply a load which may be capacitive with a high voltage, for example 270 V.

In the embodiment represented in FIG. 1, the switch comprises an IGBT transistor T1 connected to the ground by means of a fuse F. A supply voltage V2, for example in the order of 8 V, supplies the electronic components forming the control circuit of the transistor T1.

The gate of the transistor T1 is connected to a control circuit whose output stage 2 comprises a resistor R1 connecting the gate to the ground and an npn-type transistor T2 whose base is connected to an output 3 of a time delay circuit 4 and connecting the gate to the supply voltage V2. A switch closing or opening signal is applied to the input 5 of the time delay circuit 4 by means of a switching circuit 6. The gate of the transistor T1 is also connected to the ground by a grounding circuit controlled by the input signal of the time delay circuit 4. The grounding circuit comprises, for example, a resistor R2 in series with a pnp-type transistor T3 whose base is connected to the input 5 of the time delay circuit. A transistor T4, whose base is connected by an inverter 7 to the input 5 of the time delay circuit, connects the base of the transistor T2 to the ground. The gate of the transistor T1 is in addition connected by a resistor R3 to the output of a regulating circuit 8 to whose input the voltage at the terminals of the fuse F is applied.

The assembly described above operates as:

When the switching circuit 6 is open, a low state logic signal is available at the input 5 turning the transistor T3 on. This logic signal, applied to the input of the inverter 7, also turns the transistor T4 on, turning the transistor T2 off. The control voltage applied to the gate of the transistor T1 is zero and the transistor T1 is off.

When the switching circuit 6 is closed, a high state logic signal is available at the input 5, turning the transistors T3 and T4 off. The signal available at the output 3 of the time delay circuit 4, initially in low state, turning the transistor T2 off, switches to high state after a preset time delay t1, for example 2 s, defined by the time delay circuit. After this time delay t1, the transistor T2 is turned on and the supply voltage V2 is applied to the gate of the transistor T1. This supply voltage V2 corresponds to the rated control voltage of the transistor T1 and a preset rated current, for example 30 A, flows through the transistor T1 to supply the load.

During the time delay t1, after a closing signal has been applied to the control circuit of the switch, the transistors T2, T3 and T4 are turned off and the gate voltage of the transistor T1 is controlled by the regulating circuit 8 which regulates the current in the switch to a reference value. The fuse F acts as a measuring shunt, the voltage at its terminals being proportional to the current flowing through the transistor T1. This voltage is applied to the terminals of the regulating circuit 8 comprising an amplifying circuit 9 whose output is connected to an input (−) of a comparator 10. The other input (+) of the comparator 10 is connected to a reference voltage Vref, which can for example be derived from the supply voltage V2 by a divider bridge or adjustable resistance. The transistor T1 then operates as a current generator, the value of the current being limited to a value, for example 100 mA, much lower than the rated current of the switch. The value of this inrush current is fixed by the reference voltage Vref.

Figure 2:
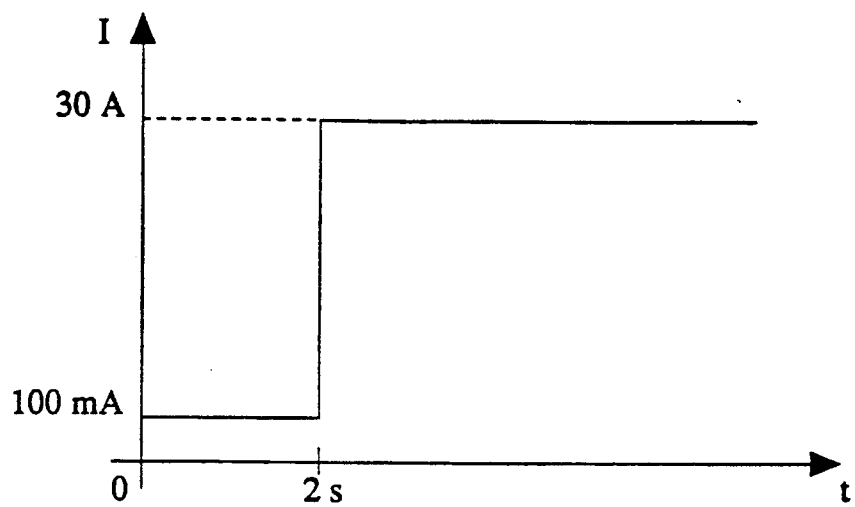
FIG. 2 represents the variation, in terms of time, of the current in a switch according to the invention on closing.

FIG. 2 illustrates the variation against time of the current I in the switch according to FIG. 1, when the latter closes. The switch first operates as a current generator, producing a constant current, of 100 mA, during the time delay period (2 s), after which a much higher rated current, for example 30 A, flows through it. The time delay period is chosen so as to enable a capacitive load 1 to be charged at a constant current up to the DC voltage V1 before the end of the time delay, thus eliminating any overload on startup due to the capacitive load being charged too quickly.

Figure 3:
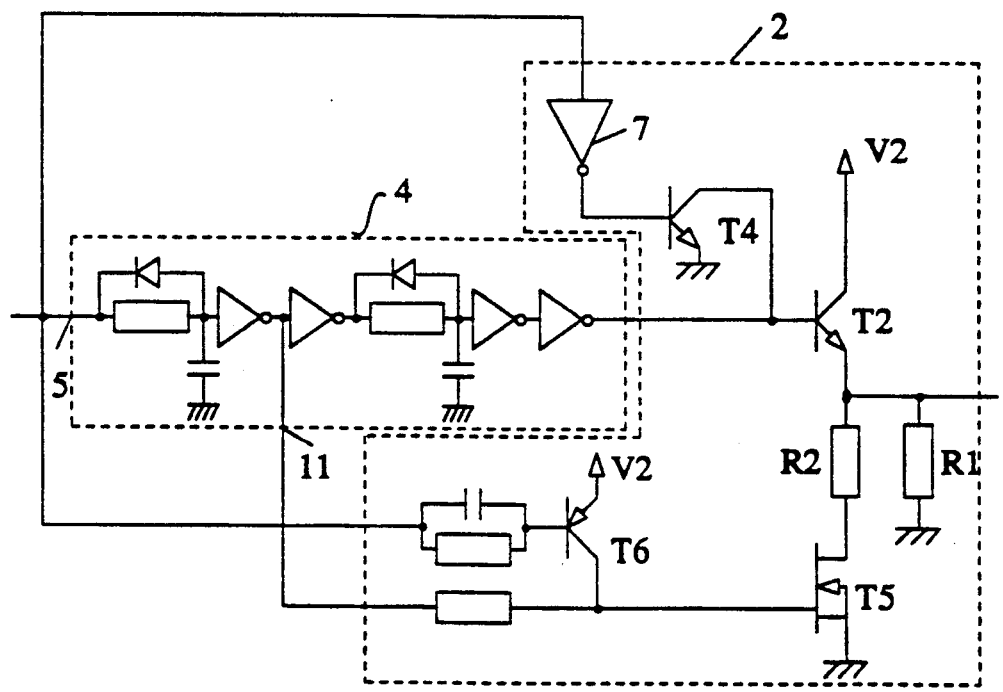
FIG. 3 illustrates certain details of an alternative embodiment of a switch according to the invention.

FIG. 3 represents in greater detail a particular embodiment of the time delay circuit 4 and an alternative embodiment of the output stage 2.

In this alternative embodiment, the pnp-type transistor T3 of FIG. 1 is replaced by a MOS-type transistor T5, whose base is connected to a second output 11 of the time delay circuit and to the collector of a pnp-type transistor T6, whose emitter is connected to the supply voltage V2 and whose base is connected to the input 5 of the time delay circuit.

The time delay circuit is designed in such a way as to supply on its second output 11 a complementary signal to the input signal 5 but delayed by a second preset time delay t2, much shorter than the time delay t1 mentioned above. To give an example, this second time delay t2 may be in the order of one tenth of the time delay t1.

With this alternative embodiment, an opening signal of the switch (0 at input 5) turns, as previously, the transistor T4 on and turns the transistor T2 off. At the same time it turns the transistors T6 and T5 on, forcing the gate of transistor T1 to zero. When a closing signal (1 at input 5) is applied at a time to, the transistors T4 and T6 are turned off. The output 11, initially at 1, remains at 1 for a time equal to the time delay t2, T5 remaining on until the time to+t2 when it turns off. The output 3, initially at 0, remains at 0 for a time equal to the time delay t1, T2 remaining off until the time to+t1 when it turns on. The closing cycle is thus divided into three periods:

A first period, between to and to+t2, when T2 being off and T5 on, the gate of transistor T1 is forced to 0.

A second period, between to+t2 and to+t1, when T2 and T5 being off, the gate voltage of transistor T1 is controlled by the regulating circuit 8, transistor T1 operating as a current generator.

A third period, after the time to+t1, when T5 is off and T2 on, making transistor T1 operate at its rated voltage. The first period is designed to enable the amplifying circuit 9 of the regulating circuit 8 to be zero reset. In fact, during this period, there is no current flowing through the fuse F and the voltage applied to the input of the amplifying circuit is zero.

Due to the use of the fuse F, of very low resistance, as current measuring shunt, no high resistance is introduced into the circuit. However the voltage at the terminals of the fuse is very low, for example 200 microvolts for a current of 100 mA.

Figure 4:
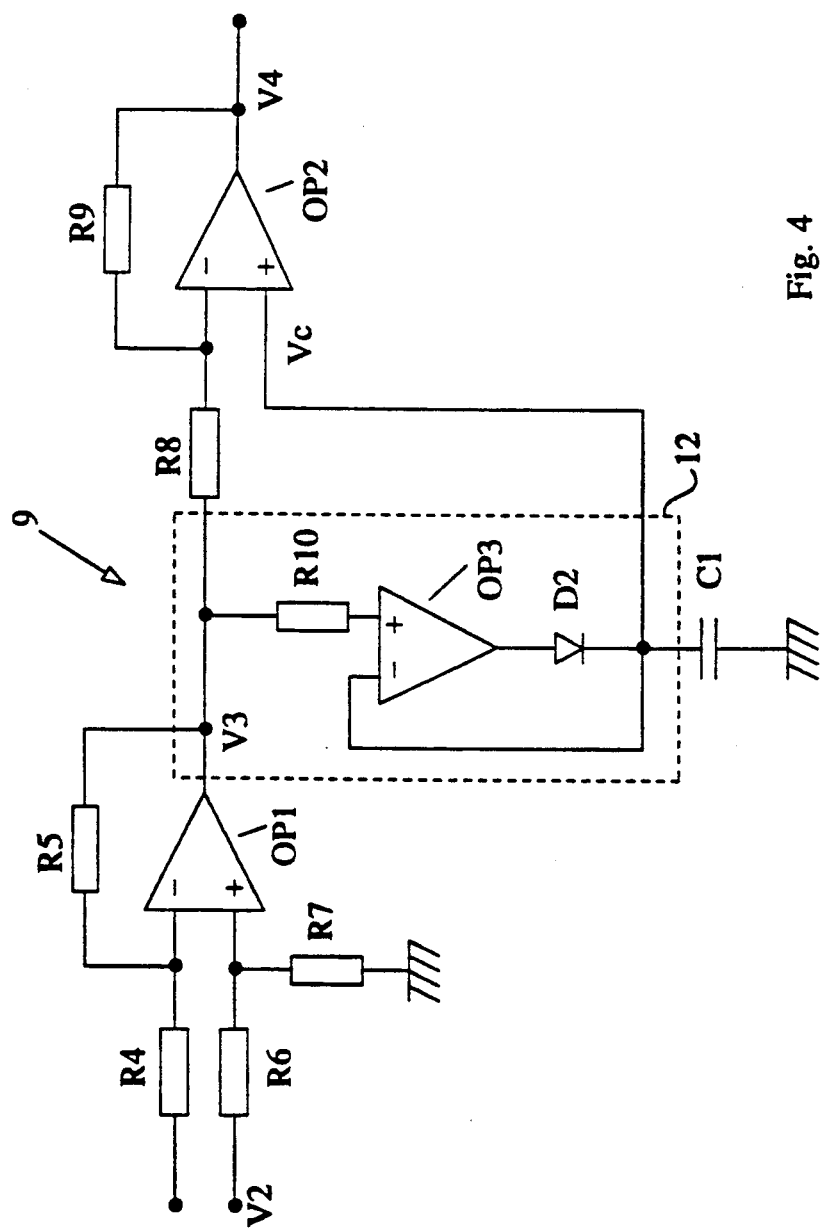
FIG. 4 is a representation of a particular embodiment of the amplifying circuit of the switch according to FIG. 1.

To enable such a voltage to be measured, the preferred embodiment of the amplifying circuit 9, represented in FIG. 4, comprises an automatic correction of the offset voltage.

This amplifying circuit comprises a first operational amplifier OP1. The inverting input of the first amplifier OP1 is connected to the input of the circuit 9 by a resistor R4, and to the output of the first amplifier by a resistor R5. Its non-inverting input is connected to the common point of two resistors R6 and R7 connected in series between the supply voltage V2 and ground, so as to set the offset voltage Vo of the amplifier OP1 to a preset value, for example +10 mV, higher than the maximum offset voltage (±7 mV, for example) given by the manufacturer.

The output of the operational amplifier OP1 is connected to the ground via a no-threshold diode 12 in series with a capacitor C1. The voltage Vc at the terminals of the capacitor C1 is applied to the non-inverting input of a second operational amplifier OP2, whose inverting input is connected to the output of the first operational amplifier OP1 by a resistor R8 and to its own output by a resistor R9. The output of the second amplifier OP2 constitutes the output of the amplifying circuit 9. In the figure, the no-threshold diode 12 is formed by a third operational amplifier OP3 whose non-inverting input is connected by a resistor R10 to the output of the first amplifier OP1, and whose output is connected to the anode of a diode D2 whose cathode is connected to the capacitor C1. The inverting input of the amplifier OP3 is connected to the cathode of the diode D2.

The amplifying circuit 9 is thus formed by an inverting amplifier (OP1, R4, R5) with a gain $K1 = R5/R4$, a no-threshold diode 12, a capacitor C1 and a differentiating amplifier (OP2, R8, R9) with a gain $K2 = R9/R8$. To give an example, K1 can be chosen equal to 100 and $K2 = 10$.

The amplifying circuit 9 operates as follows:

The circuit input voltage being zero (switch open), the offset voltage Vo of the first amplifier OP1 is multiplied by the gain K1 of the latter and the capacitor C1 is charged at a voltage $Vc = Vo \cdot K1$.

This value, corresponding to the amplified offset voltage, is therefore stored in the capacitor C1.

When the switch closes a positive voltage Vf, corresponding to the voltage at the terminals of the fuse F, is applied to the input of the amplifying circuit 9. The output voltage V3 of the first amplifier is then given by:

$$V3 = (Vo - Vf) \cdot K1 \qquad (1)$$

This voltage is lower than the charging voltage Vc of the capacitor C1 and the no-threshold diode 12 prevents the latter from discharging.

The differentiating amplifier (OP2, R8, R9) amplifies the difference between the voltages Vc and V3 and supplies a voltage V4 on output:

$$V4 = (Vc - V3) \cdot K2 = Vf \cdot K1 \cdot K2 \qquad (2)$$

The voltage obtained at the output of the second amplifier OP2 corresponds to the amplified voltage Vf, the offset voltage of OP1 being corrected automatically. The offset voltage of OP2 is for its part negligible compared with $Vc - V3$.

To give an example, for Vo=10 mV, Vf=100 microvolts, K1=100 and K2=10, we obtain:
Vc=1 V
V3=990 mV
V4=100 mV A zero reset circuit, not represented, of the capacitor C1 can be provided so that the stored offset voltage is correct when the switch closes.

The switching circuit 6 of FIG. 1 can be controlled by external control signals, the switch operating as a contactor. The closing and opening signals applied to the time delay circuit 4 can also be supplied by internal fault detection means so as to bring about opening of the switch when an overload or short-circuit is detected, reset means then being provided to bring about closing of the switch which then operates as a circuit breaker. Both types of function, contactor and circuit breaker, can be combined without difficulty in the same switch.

Figure 5:
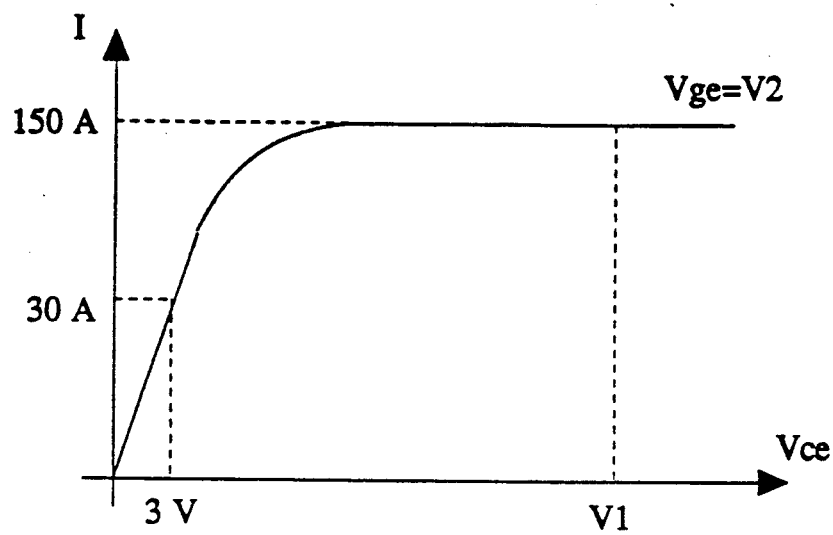
FIG. 5 represents the current/voltage characteristic of an IGBT type transistor.
Figure 6:
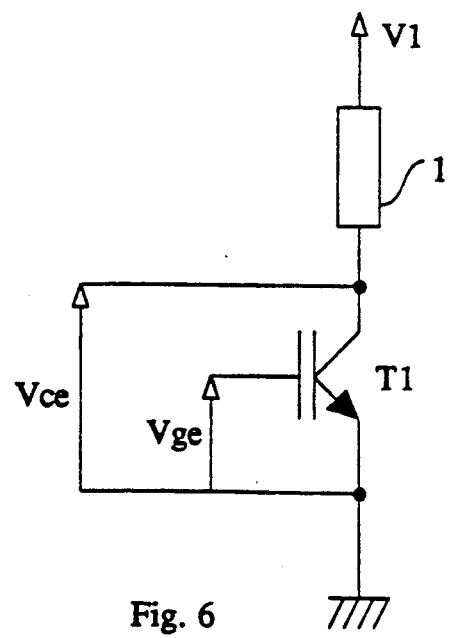
FIG. 6 illustrates the fault detection principle in a static switch.

FIGS. 5 and 6 illustrate the detection principle of a fault, and more particularly of a short-circuit, in a static switch, notably applicable to a switch as described above.

Unlike state-of-the-art fault detection circuits, the principle described below does not use a measuring shunt designed to measure the current flowing through the transistor T1. According to the invention, the voltage Vce at the terminals of the transistor T1 (FIG. 6) is used to detect a fault. For a preset gate-emitter voltage Vge, for example equal to the supply voltage V2, the current/voltage characteristic of the transistor T1 is of the type represented in FIG. 5. For a preset rated operating current, for example 30 A, the voltage Vce is in the order of a few volts, for example 3 V. In the event of an overload, however, the current increases, at maximum up to the saturation current, for example 150 A, and the voltage increases substantially, and can reach the level of the DC supply voltage V1 of the switch.

Figure 7:
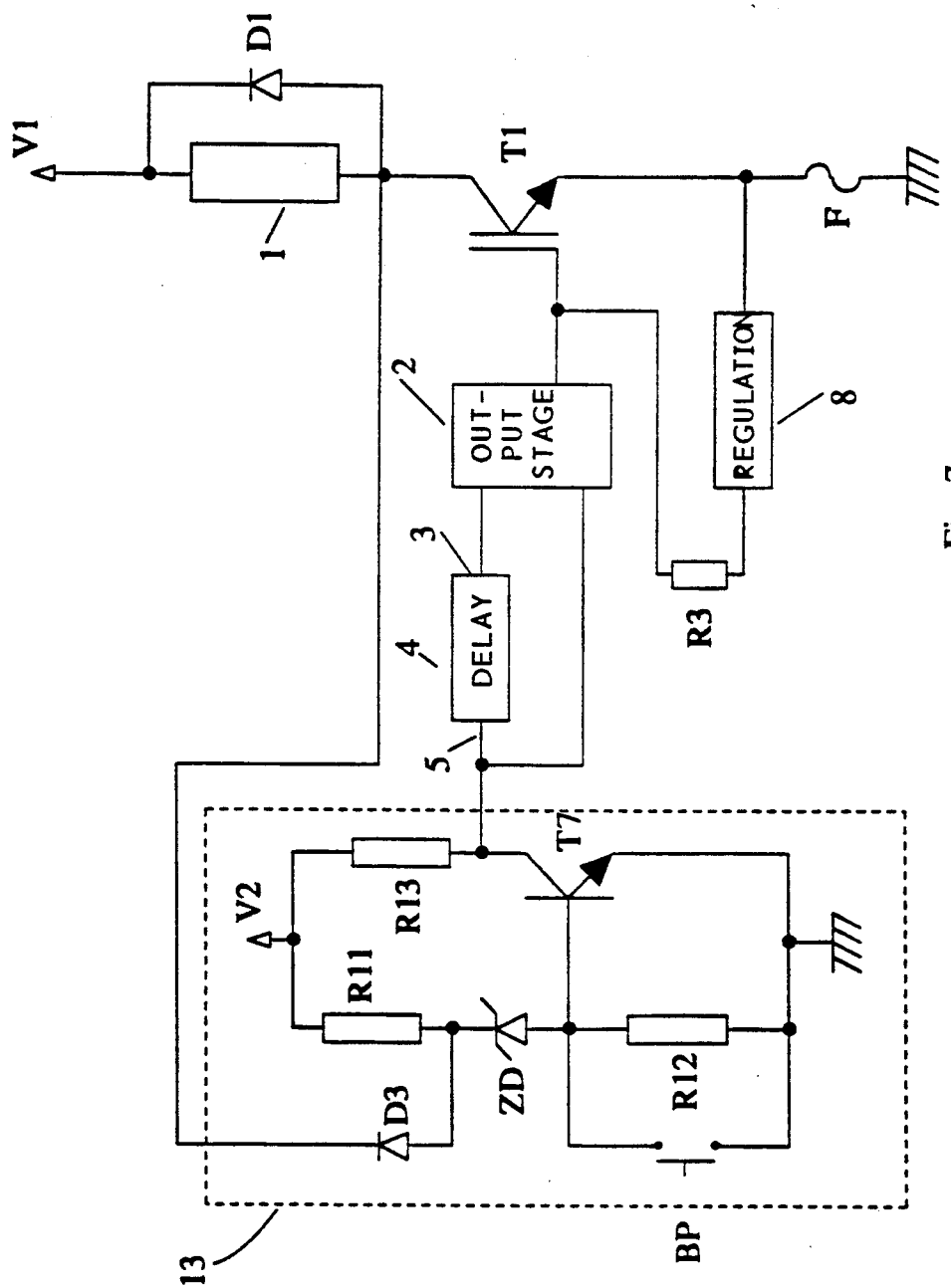
FIG. 7 represents a particular embodiment of a switch/circuit breaker according to the invention.

FIG. 7 represents a switch of the type represented in FIG. 1, comprising a particular embodiment of a short-circuit detection circuit 13.

As the resistance of the fuse F is negligible, the collector voltage of the transistor T1 is appreciably equal to the voltage Vce of the transistor and is used to detect a fault. The cathode of a diode D3 is connected to the collector of the transistor T1. The anode of the diode is connected to the supply voltage V2 by means of a resistor R11. This resistor R11 is connected in series, between V2 and the ground, with a Zener diode ZD and a resistor R12. A transistor T7 has its base connected to the common point of the Zener diode ZD and the resistor R12, its emitter being grounded and its collector connected to the supply voltage V2 via a resistor R13. The collector of the transistor T7 constitutes the output of the detection circuit 13 and in the event of a short-circuit supplies a tripping signal, or opening signal, designed to be applied to the input 5 of the time delay circuit 4. A reset pushbutton BP is connected in parallel to the resistor R12.

In normal operation of the switch, the transistor T1 is on and has flowing through it a rated current such that the voltage at its terminals is in the order of 2 to 3 V. The diode D3, polarized by the resistor R11, is on. The Zener diode ZD has a higher turn-on voltage than the voltage then present at the anode of the diode D3 and is off. The transistor T7 is therefore off and the output voltage of the detection circuit 13 is at its high level. A closing signal of the switch remains applied to the time delay circuit 4.

In the event of a short-circuit, the current I in the transistor T1 becomes very great, while remaining limited to its saturation current, and the voltage on its collector increases. As soon as this voltage exceeds the polarization voltage of the diode D3, the latter turns off and the Zener diode, polarized by the resistor R11 and the supply voltage V2 turns on, turning on the transistor T7, whose collector switches to zero. The output signal of the detection circuit 13, switching to zero, causes the transistor T1 to turn off and the switch to open. The collector voltage of T1 then remains high (V1) and the detection circuit 13 continues to supply an opening signal (O) to the time delay circuit.

The turn-on voltage of the Zener diode ZD, for example 6.2 V, is determined so as to supply a fault signal when the transistor T1 is saturated. The fault current during a short-circuit is then limited to the saturation current corresponding to the voltage applied to the gate of T1.

To reset the switch/circuit breaker, the transistor T7 must be off, causing the output signal of the fault detection circuit 13 to switch to 1. Reset means of this kind are represented schematically in FIG. 7 by the pushbutton BP, closing of which turns the transistor T7 off. The switch then closes in the manner described with reference to FIG. 1 and, as soon as the collector voltage of the transistor T1 is sufficiently low, the diode D3 turns on again and keeps the transistor T7 turned off.

The switch/circuit breaker can be completed by a fault indication circuit, by an overload detection circuit supplying an opening signal in the event of detection of an overload, and by an external control circuit enabling it to be made to operate as a contactor as well. The overload detection circuit can also use the variations of the transistor T1 collector voltage, the transistor T1 collector voltage exceeding a certain threshold for a preset period being representative of an overload.

We claim:

1. A static switch comprising: a semi-conductor device, which is connected in series with a load to the terminals of a DC voltage supply during operation; control means for controlling an operating voltage of the semi-conductor device; means for measuring the current flowing in the semi-conductor device; and regulating means for regulating the operating voltage of the semi-conductor device in terms of said current; wherein the control means comprises a time delay circuit, to one input of which a switch closing or opening signal is applied during operation, and circuit means, connected to an output of the time delay circuit, for producing a rated operating voltage of the semi-conductor device after a preset time delay period following the application of a closing signal to the input of the time delay circuit; and wherein the regulated operating voltage produced by the regulating means is applied to the semi-conductor device during said time delay period so that the semi-conductor device operates during said time delay period as a current generator, thereby limiting the current permitted to pass through the static switch to a preset value that is much lower than the rated current of the static switch.

2. The static switch according to claim 1, wherein the means for measuring the current includes a fuse connected in series with the semi-conductor device, and wherein the voltage at the terminals of said fuse, being representative of said current, is applied to an input of the regulating means.

3. The static switch according to claim 2, wherein the regulating means comprises an amplifying circuit with automatic correction of an offset voltage, to whose input the voltage representative of the current is applied, and a comparator for comparing the output signal of the amplifying circuit with a reference signal, the amplifying circuit comprising a first operational amplifier whose output is connected to a first input of a second operational amplifier and to a no-threshold diode whose cathode is connected to a capacitor, the voltage at the terminals of the capacitor being applied to a second input of the second operational amplifier whose output constitutes the output of the amplifying circuit.

4. The static switch according to claim 1, wherein the current flowing through the static switch is limited to approximately 100 mA during the time delay period.

5. The static switch according to claim 1, wherein the semi-conductor device includes an operating electrode, and wherein the control means includes means for grounding the operating electrode of the semi-conductor device when a switch opening signal is applied to the input of the time delay circuit and for a preset time following the application of a closing signal to the input of the time delay circuit, so as to enable the regulating means to be zero reset.

6. The static switch according to claim 1, further comprising fault detection means for producing said opening signal in the event of an overload or short-circuit being detected, and reset means for producing said closing signal.

7. The static switch according to claim 6, wherein said fault detection means comprises means for detecting the voltage at first and second terminals of the semi-conductor device and means for producing the opening signal when the detected voltage exceeds a first present threshold for a preset time, representative of an overload, or when it exceeds a second preset threshold, representative of a short-circuit, for which the semi-conductor device is saturated.

8. The static switch according to claim 7, wherein the first terminal of the semi-conductor is connected to the DC voltage supply via the load, the means for measuring the voltage at the terminals of the semi-conductor device comprise a diode whose cathode is connected to the first terminal of the semi-conductor device and polarized so as to be turned off when said first terminal voltage exceeds the second threshold, the fault detection means producing an opening signal when said diode is off.

9. The static switch according to claim 8, wherein the semi-conductor device comprises an insulated gate bipolar transistor and wherein the first terminal of the semi-conductor device is a collector terminal.

10. The static switch according to claim 1, wherein the semi-conductor device comprises an insulated gate bipolar transistor.

* * * * *